US012501699B1

(12) United States Patent
Chowdhury (10) Patent No.: US 12,501,699 B1
(45) Date of Patent: Dec. 16, 2025

(54) SEMICONDUCTOR DEVICE WITH VERTICALLY STACKED GAN COMPLEMENTARY FETS

(71) Applicant: e2GaN S. A., Luxembourg (LU)

(72) Inventor: Nadim Chowdhury, Luxembourg (LU)

(73) Assignee: E2GAN S.A., Luxembourg (LU)

( * ) Notice: Subject to any disclaimer, the term of this patent is extended or adjusted under 35 U.S.C. 154(b) by 0 days.

(21) Appl. No.: 19/241,538

(22) Filed: Jun. 18, 2025

(51) Int. Cl.
*H10D 30/01* (2025.01)
*H10D 30/47* (2025.01)
*H10D 62/824* (2025.01)
*H10D 84/01* (2025.01)
*H10D 84/85* (2025.01)

(52) U.S. Cl.
CPC ......... *H10D 84/856* (2025.01); *H10D 30/015* (2025.01); *H10D 30/472* (2025.01); *H10D 30/475* (2025.01); *H10D 30/4755* (2025.01); *H10D 62/824* (2025.01); *H10D 84/0167* (2025.01)

(58) Field of Classification Search
None
See application file for complete search history.

(56) References Cited

U.S. PATENT DOCUMENTS

2024/0162299 A1  5/2024  Buckley et al.
2024/0405024 A1* 12/2024  Radhakrishna ...... H10D 89/215

* cited by examiner

Primary Examiner — Grant S Withers
(74) Attorney, Agent, or Firm — NIXON & VANDERHYE (57) ABSTRACT

This disclosure pertains to a semiconductor device comprising a substrate layer, a buffer layer arranged on the substrate layer, a channel layer arranged on the buffer layer, and a barrier layer forming a two-dimensional electron gas (2DHG) at its interface with the channel layer, a plurality of epitaxial layers arranged on the barrier layer forming a two-dimensional hole gas, a plurality of source terminals, of drain terminals, and a gate terminal arranged over a passivation layer positioned on one of the epitaxial layers, the gate terminal being configured to control electrical conduction in two-dimensional electron gas and in the a two-dimensional hole gas (2DHG).

15 Claims, 5 Drawing Sheets

SEMICONDUCTOR DEVICE WITH VERTICALLY STACKED GAN COMPLEMENTARY FETS

TECHNICAL FIELD

The present disclosure relates to a semiconductor device. Specifically, the present disclosure pertains to a semiconductor device comprising vertically stacked gallium nitride, GaN, Field Effect Transistors, FETs, such as complementary FETs. The present disclosure also relates to a method of manufacturing a semiconductor device. Specifically, the present disclosure also pertains to a method of manufacturing a semiconductor device comprising vertically stacked GaN FETs, such as complementary FETs.

BACKGROUND

Silicon-based power semiconductor devices, such as Insulated Gate Bipolar Transistors, called IGBTs, and Laterally Diffused Metal-Oxide Semiconductors, called LDMOS, have long been utilized due to their established fabrication processes. However, these devices are limited by their low critical electric field, called E-field, and high on-resistance, called RON, making them less suitable for high-power, high-efficiency applications.

Gallium nitride, or GaN, is an III-N compound that offers significant advantages over silicon, including a wider bandgap, higher critical E-field, and lower on-resistance. These properties enable GaN devices to handle higher voltages with greater efficiency, making them ideal for power electronics.

For instance, a field-effect transistor having the behavior of a p-FET transistor and a high current density is discussed in US patent application No. US 2024/0162299 A1 as involving a p-doped GaN layer. In particular, this transistor comprises one or more electron and hole channel layers, forming a two-dimensional electron gas, called 2DEG and corresponding to an n-channel, a two-dimensional hole gas, called 2DHG and corresponding to a p-channel, as well as a p-doped semiconductor material layer above the hole channel, these various elements inducing polarization effects usable in a corresponding integrated circuit.

However, this structure does not allow for compact integration, as it lacks a monolithic configuration and is unsuitable for high-density integration. Moreover, the discussed structures do not provide any CMOS, or complementary metal-oxide-semiconductor, functionality, which is necessary for high-frequency and high-power electronics.

The absence of a well-established GaN CMOS technology leads to considerable challenges in the integration of driver circuits with GaN power devices. Current techniques involve separate dies for the driver circuits and power devices, which introduce parasitics from bonding wires and packaging. These parasitics subsequently result in unwanted noise, signal ringing, and ultimately diminish the overall system performance and efficiency.

The development of improved GaN CMOS technologies is crucial to fully realize the potential of GaN in power applications and minimize parasitic effects, improving overall performance. There is an unmet need for a GaN CMOS technology that can overcome these challenges and enhance the efficiency of power systems.

SUMMARY

To address this or these drawbacks, it is proposed according to a first aspect of the present disclosure a semiconductor device comprising:

a substrate layer,
a buffer layer arranged on the substrate layer,
a channel layer arranged on the buffer layer,
a barrier layer arranged on the channel layer, the barrier layer forming a two-dimensional electron gas at an interface with the channel layer,
a plurality of epitaxial layers arranged on the barrier layer, forming a two-dimensional hole gas at an interface with the barrier layer,
at least two source terminals, a first of the at least two source terminals, called first source terminal, being electrically connected to the two-dimensional electron gas, and a second of the at least two source terminals, called second source terminal, being electrically connected to the two-dimensional hole gas,
at least two drain terminals, a first of the at least two drain terminals, called first drain terminal, being electrically connected to the two-dimensional electron gas, and a second of the at least two drain terminals, called second drain terminal, being electrically connected to the two-dimensional hole gas, and
a gate terminal arranged over a passivation layer of the semiconductor device, the passivation layer being positioned over one of the epitaxial layers, the gate terminal being configured to control electrical conduction in the two-dimensional electron gas and in the two-dimensional hole gas.

Herein, a two-dimensional electron gas is denoted as a "2DEG" or (2DEG) whereas a two-dimensional hole gas gas is denoted as a "2DHG" or (2DHG).

This enables an independent control of n-FET and p-FET charge carriers, ensuring effective complementary device operation in a GaN CMOS platform. It is also possible to ensure a simultaneous modulation of both the n-FET and the p-FET conduction paths, with a shared gate structure.

In an embodiment, one of the epitaxial layers comprises unintentionally doped gallium nitride, UID-GaN.

This enables the formation of a high-mobility channel for charge carriers without intentional doping-induced scattering.

In an embodiment, one of the epitaxial layers comprises p-type doped gallium nitride, p-GaN. This enables hole conduction in the p-channel, allowing for the formation of a complementary p-FET to match the n-FET in a GaN CMOS structure.

In an embodiment, one of the epitaxial layers comprises p++-doped gallium nitride, p++-GaN.

This enables enhanced hole injection efficiency and reduces contact resistance in the p-FET, thereby also ensuring symmetrical CMOS operation.

In a possible embodiment, the epitaxial layer comprising p++-GaN comprises p++-GaN with a higher doping concentration than the concentration of p-GaN comprised in the epitaxial layer comprising p-GaN.

In an embodiment, the barrier layer is a III-N barrier layer.
In an embodiment, the barrier layer comprises aluminum gallium nitride, AlGaN.

This enables formation of a high-mobility two-dimensional electron gas at an interface with a channel layer.

In an embodiment, the first source terminal and the first drain terminal are arranged on a first plane extending substantially along the channel layer, and the second source terminal and the second drain terminal are arranged on a second plane distinct from the first plane and extending substantially along one of the epitaxial layers.

This enables vertical integration of an n-FET and a p-FET while ensuring independent electrical conduction paths.

In an embodiment, the first drain and first source terminals are positioned on a common horizontal plane, and the second drain and second source terminals are situated on a separate horizontal plane, with the two planes distinctly separated.

This enables layout optimization of the device, which further reduces inter-device parasitics while maintaining a compact and scalable CMOS configuration.

In an embodiment, the first drain terminal and the first source terminal are arranged on a first plane, and the second drain terminal and the second source terminal are arranged on a second plane distinct from the first plane.

This enables electrical isolation between the n-FET and p-FET terminals.

In an embodiment, the gate terminal is arranged over the passivation layer, the passivation layer being positioned between the gate terminal and one of the epitaxial layers.

This enables suppression of gate leakage current and passivation of interface defects.

In an embodiment, the first source terminal and the first drain terminal are ohmic to electrons, and the second source terminal and the second drain terminal are ohmic to holes.

This enables low-resistance electrical contacts optimized for n-FET and p-FET operation, ensuring efficient carrier injection and reducing parasitic resistances.

In an embodiment, the gate terminal comprises a single gate terminal, the single gate terminal encapsulating a plurality of fins of the semiconductor device, each fin extending into the channel layer, the plurality of fins including a first set of fins extending into a region of the formed two-dimensional electron gas, the plurality of fins further including a second set of fins extending into a region of the formed two-dimensional hole gas, the first set of fins and the second set of fins being arranged transversely to each other.

This enables a reduction in input capacitance and eliminates additional metal interconnections between separate gate terminals, thereby improving switching performance and reducing delay in CMOS applications. The transverse arrangement of the fins allows for an effective spatial separation of electrical contacts while mitigating non-homogeneous potential distribution across the device.

In an embodiment, the gate terminal extends over and along at least three sides of each fin of the plurality of fins, the plurality of fins including a first set of fins extending into a region of the formed two-dimensional electron gas and a second set of fins extending into a region of the formed two-dimensional hole gas, the passivation layer being positioned between the gate terminal and the plurality of fins.

This improves electrostatic control over the conduction channels, mitigating short-channel effects and enhancing the switching efficiency and power performance of the semiconductor device. The gate terminal extending along at least three sides of the fins ensures improved gate coupling, allowing for enhanced modulation of charge carriers for both the n-FET and p-FET.

In an embodiment, the first set of fins defines a first Field Effect Transistor, called first FET, and the second set of fins defines a second Field Effect Transistor, called second FET, the number and the pitch of the fins of the first FET and the number and the pitch of the fins of the second FET being selected according to the proportionality equations $$\frac{W_n}{L_n} \approx \frac{n_{n\text{-}fin} \times W_{n\text{-}fin}}{n_{p\text{-}fin} \times W_{p\text{-}fin}}, \text{ and}$$

-continued
$$\frac{W_p}{L_p} \approx \frac{n_{p\text{-}fin} \times W_{p\text{-}fin}}{n_{n\text{-}fin} \times W_{n\text{-}fin}},$$

$W_n$ and $W_p$ denoting the effective channel widths of the first FET and the second FET, respectively, $L_n$ and $L_p$ denoting the effective channel lengths of the first FET and the second FET, respectively, $n_{n\text{-}fin}$ and $n_{p\text{-}fin}$ denoting the respective numbers of fins of the first FET and the second FET, $W_{n\text{-}fin}$ and $W_{p\text{-}fin}$ denoting the respective fin widths of the first FET and the second FET.

This enables a fine tuning of the (current-) driving capabilities of the first FET and of the second FET, allowing compensation for differences in electron and hole mobility while maintaining a compact device layout. By selecting the number of fins and their pitch according to the given proportionality relations, the drive current of the second FET can be matched to that of the first FET without excessive widening.

For instance, in a possible embodiment or aspect of the disclosure, it is possible to precisely tune the width-to-length ratio of the first transistor and the second transistor, ensuring matched current-driving capabilities in a GaN CMOS platform while compensating for differences in electron and hole mobility. By adjusting the number of fins and fin pitch, the second transistor can achieve a drive current comparable to that of the first transistor without excessive device widening.

Furthermore, the proportionality equations establish a direct link between the physical design of the semiconductor device and its equivalent circuit representation, wherein a first source terminal and a second source terminal correspond to respective source contacts of the first and second transistors, a first drain terminal and a second drain terminal correspond to respective drain contacts of the first and second transistors, and a single gate terminal governs the conduction of both channels.

This enables achieving systematic circuit-level control through precise structural modifications at the device level.

According to another aspect of the disclosure, it is proposed a method of manufacturing a semiconductor device, comprising the steps of:

forming a buffer layer on a substrate,
forming a channel layer on the buffer layer,
forming a barrier layer on the channel layer, a two-dimensional electron gas being induced at an interface between the channel layer and the barrier layer,
forming a plurality of epitaxial layers on the barrier layer, a two-dimensional hole gas being induced at an interface between the barrier layer and at least one of the epitaxial layers,
forming a passivation layer over one of the epitaxial layers,
forming a gate terminal over the passivation layer, the gate terminal being configured to control electrical conduction in both the two-dimensional electron gas and the two-dimensional hole gas,
forming at least two source terminals, a first of the at least two source terminals, called first source terminal, being electrically connected to the two-dimensional electron gas (2DEG), and a second of the at least two source terminals, called second source terminal, being electrically connected to the two-dimensional hole gas, and
forming at least two drain terminals, a first of the at least two drain terminals, called first drain terminal, being electrically connected to the two-dimensional electron gas (2DEG), and a second of the at least two drain terminals, called second drain terminal, being electrically connected to the two-dimensional hole gas.

BRIEF DESCRIPTION OF THE DRAWINGS

Other features, embodiments, definitions and advantages will become apparent upon reading the detailed description below and analyzing the attached drawings, including the following figures.

The provided figures depict one or more exemplary embodiments. Accordingly, the figures are not intended to limit the scope of the inventions. It will be apparent that apparatuses and methods are shown in block diagram form only in order to avoid obscuring the present disclosure.

Unless otherwise indicated, common or analogous elements in the figures are denoted by the same reference numerals and exhibit identical or analogous features, so that common or analogous elements are generally not described again for the sake of clarity and conciseness.

DESCRIPTION OF THE EMBODIMENTS

Figure 1:
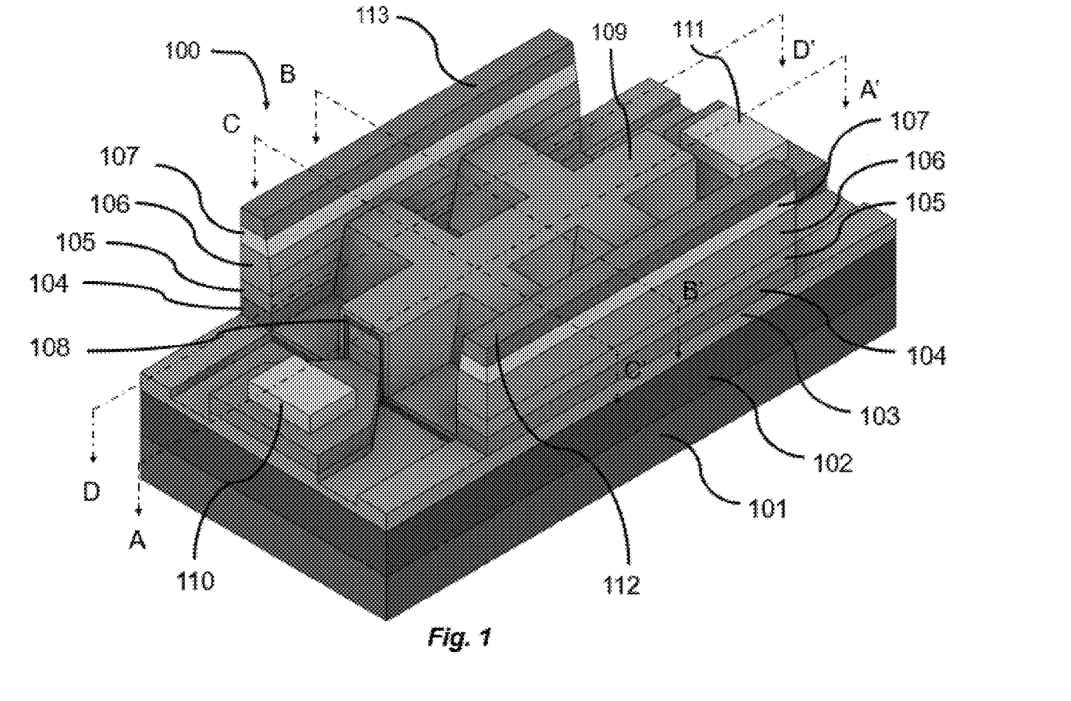
FIG. 1 is a schematic illustrating a three-dimensional view of a semiconductor device, according to an embodiment of the disclosure.

FIG. 1 represents a three-dimensional view of a semiconductor device, according to an embodiment of the disclosure.

In particular, a three-dimensional schematic of the semiconductor device 100 is illustrated according to one possible embodiment.

The semiconductor device 100 includes epitaxial layers including a substrate 101, for instance a silicium substrate, and a buffer layer 102 positioned on top of the substrate 101.

In one embodiment, the buffer layer 102 includes one or more nucleation and strain relief layers (not represented).

In one embodiment, the buffer layer 102 comprises aluminum nitride (AlN) and aluminum gallium nitride, noted $Al_xGa_{1-x}N$ where x is strictly larger than 0 and smaller than 1, such that $0<x\leq1$.

A gallium nitride, GaN, channel layer 103 is located or placed during manufacture on top of the buffer layer 102. As illustrated, a barrier layer 104 made of a III-N material is located on top of the GaN channel layer 103.

Advantageously, in one possible embodiment, the vertical thickness of the barrier layer 104 ranges from 5 to 30 nanometers (nm).

In one possible embodiment, the thickness of the GaN channel layer 103 is ten times larger than the thickness of the III-N barrier layer 104, i.e 10× thicker, or 1000% thicker.

In one possible embodiment, the III-N barrier layer 104 comprises aluminum gallium nitride, or AlGaN. In alternatives, the III-N layer comprises $Al_xIn_yGa_{1-x-y}N$ such that a value of "x" and "y" is comprised between 0 and 1, such that $0\leq x\leq 1$ and $0\leq y\leq 1$ are fulfilled.

In one possible embodiment, the GaN channel layer 103 includes a band gap and the III-N barrier layer 104 includes a band gap, such that the III-N barrier layer band gap is higher than the GaN channel layer band gap.

Advantageously, positioning an aluminum gallium nitride, AlGaN, layer 104 on a GaN layer 103 enables the aluminum gallium nitride layer and the gallium nitride layer to form a junction, said junction being for instance a 2-dimensional electron gas, called 2DEG, channel.

Herein, for the sake of clarity, any formed 2-dimensional electron gas or 2DEG will be denoted by "2DEG" in the drawings.

In one embodiment, the semiconductor device 100 includes additional layers, comprising a second doped gallium nitride layer 105 located atop the aluminum gallium nitride layer 104, and called UID GaN layer 105.

In one embodiment, the UID GaN layer 105 is un-intentionally doped.

In one embodiment, the two layers 105 and 104 form a junction that generates a 2-dimensional hole gas, called 2DHG, channel, which defines a local concentration of positively charged holes.

Herein, for the sake of clarity, any formed 2-dimensional hole gas or 2DHG will be denoted by "2DHG" in the drawings.

In one embodiment, the semiconductor device 100 further includes a p-doped GaN layer 106, called p-GaN layer 106, positioned on the second GaN layer.

In one embodiment, the semiconductor device 100 further includes a p++-doped GaN layer 107, called p++-GaN layer 107, which is positioned on the p-GaN layer.

In one embodiment, the p++-GaN layer 107 has a relatively stronger p-doping than the p-GaN layer 106, which is for instance achieved by doping p++-GaN layer 107 with magnesium. Advantageously, said doping is obtained with a magnesium concentration which is around $1\times10^{19}$ cm$^{-3}$, thereby achieving adequate hole concentration due to a high ionization energy of magnesium.

In one embodiment, the semiconductor device 100 comprises a plurality of terminals, for example, a first drain terminal 110, a second drain terminal 112, a first source terminal 111 and a second source terminal 113.

In one embodiment, one or more of the terminals of the semiconductor device 100 comprises fins, said fins being for instance formed by etching the layers down to the GaN channel layer 103.

In one embodiment, the semiconductor device 100 further includes a passivation layer 108, which encapsulates and protects the underlying layers from environmental influences and contamination.

Advantageously, the passivation layer 108 can be positioned over the active regions of the semiconductor device 100 and is adapted to provide electrical isolation while preventing unwanted charge accumulation.

In various embodiments, various materials or combinations of materials are used for passivation and gate oxide over the fins of the terminals of the semiconductor device 100, including but not limited to $HfO_2$, $Al_2O_3$, and others.

Advantageously, in one embodiment, the passivation layer 108 comprises a dielectric material, such as silicon nitride ($Si_3N_4$), hafnium dioxide ($HfO_2$), or aluminum oxide ($Al_2O_3$), thereby ensuring stability and reliability in the operation of the semiconductor device 100.

In one embodiment, the gate terminal 109 is positioned over the passivation layer 108, advantageously encapsulating the fins.

In one embodiment, the fins extend perpendicularly with respect to each other, forming a tri-gate architecture that enhances electrostatic control over the channels.

In one embodiment, the semiconductor device 100 comprises a high aspect ratio for the fins, ensuring optimal gate coupling and improved subthreshold slope, thereby enhancing switching performance.

Advantageously, the gate terminal 109 cab be configured to control the conduction of the underlying channels.

In one embodiment, the gate terminal 109 comprises a conductive material such as tungsten (W), titanium nitride (TiN), or polysilicon, ensuring a low resistance gate path.

Advantageously, the placement of the gate terminal 109 over the fins enables an effective electrostatic control of the carrier channels, thereby facilitating enhancement-mode operation of both the n-FET and the p-FET.

In one embodiment, advantageously, the first drain terminal 110 and the first source terminal 111 are ohmic to electrons and serve as contacts for the semiconductor device 100, equivalent to an n-FET.

For instance, in a non-limiting example, the drain terminals 110 and 112 comprise a metal stack including titanium (Ti), aluminum (Al), or nickel (Ni), ensuring low contact resistance and reliable electrical performance.

In various embodiments, the semiconductor device 100 comprises adapted structural parameters for use as a GaN CMOS. The number of fins and the pitch of fins can be adapted accordingly, and subject to design specifications, which can be adjusted as required to meet performance criteria, as discussed hereafter.

In one embodiment, advantageously, the second drain terminal 112 and the second source terminal 113 are ohmic to holes, functioning as contacts for the semiconductor device 100, equivalent to a p-FET.

In one embodiment, the first source terminal 111 and the second source terminal 113 serve as respective contact points for the n-FET and p-FET. The first source terminal 111 is positioned in the same horizontal plane as the first drain terminal 110, ensuring a compact layout for the n-channel device. Similarly, the second source terminal 113 is positioned in a separate horizontal plane along with the second drain terminal 112, forming the conduction path for the p-channel device. In one embodiment, the terminals 111 and 113 are fabricated using a self-aligned process to minimize contact resistance and improve carrier injection efficiency.

In various embodiments, as with the semiconductor device 100 equivalent to an n-FET, the number of fins, pitch of fins, and other structural parameters for the p-FET are adjustable based on design specifications to optimize performance, for instance for use as a GaN CMOS.

Figure 2:
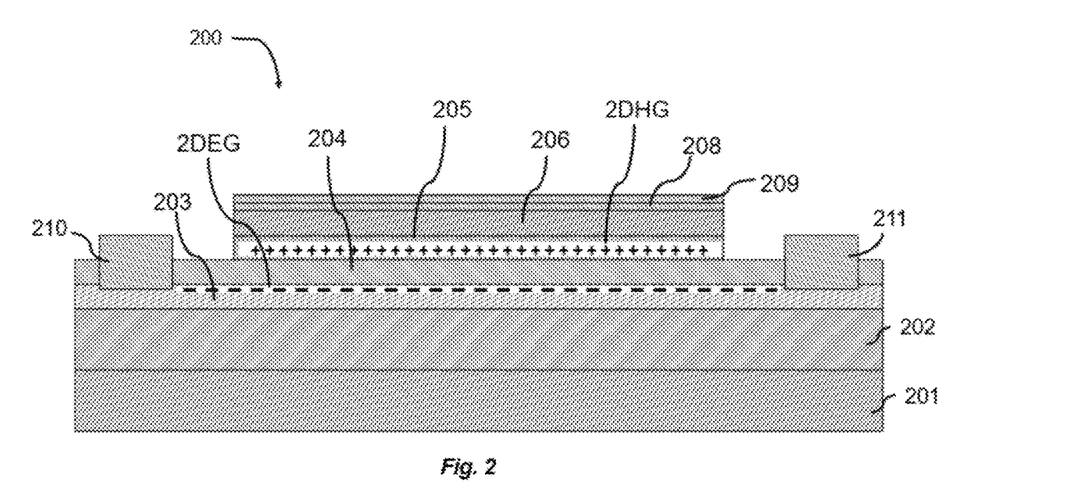
FIG. 2 is a schematic illustrating a cross-section view along an AA' axis of FIG. 1 according to an embodiment of the present disclosure.

FIG. 2 represents a cross-section view along an AA' axis of FIG. 1 according to an embodiment of the present disclosure. In the illustrated embodiment, the element 200, 201, 202, 203, 204, 205, 206, 208, 209, and 211, respectively, correspond to the element 100, 101, 102, 103, 104, 105, 106, 108, 109, and 111, respectively. The elements 107, 112 and 113 are not presently visible.

In particular, a cross-section view along an AA' axis of a semiconductor device 200 is illustrated according to one possible embodiment.

In this embodiment, the two-dimensional electron gas, "2DEG", is formed at the interface of the barrier layer 204 and of the GaN channel layer 203.

Advantageously, the two-dimensional electron gas 2DEG is enabled thanks to the difference of spontaneous and polarization charge at the interface.

In this embodiment, the UID-GaN layer 205, the p-GaN layer 206 and the p++GaN layer 207 are located above the barrier layer 204. Along with the difference of polarization charges at the interface, the two-dimensional hole gas, "2DHG", is enabled.

In one embodiment, the first drain terminal 210 and the first source terminal 211, as illustrated in this cross-section, are ohmic to electrons.

Advantageously, the conduction path from the first source terminal 211 to the first drain terminal 210 is completed by the two-dimensional electron gas, "2DEG".

Advantageously, under a zero-gate bias, the two-dimensional electron gas, 2DEG, may be depleted due to the combined effect of the fin structure and of the p-GaN layer 206 on top of the barrier layer 204 and of the UID-GaN layer 205. In other words, this enables restoring electrostatically the two-dimensional electron gas, "2DEG", by applying a positive bias to the gate terminal, thereby completing the conduction path and turning on the semiconductor device 200.

In the illustrated embodiment, the cross-section along the AA' axis only shows the top portion of the gate 209. The passivation layer 208 under the gate layer is used to reduce the gate leakage current as well as to passivate the surface traps and traps induced due to etching of the p-GaN layer 206.

Figure 3:
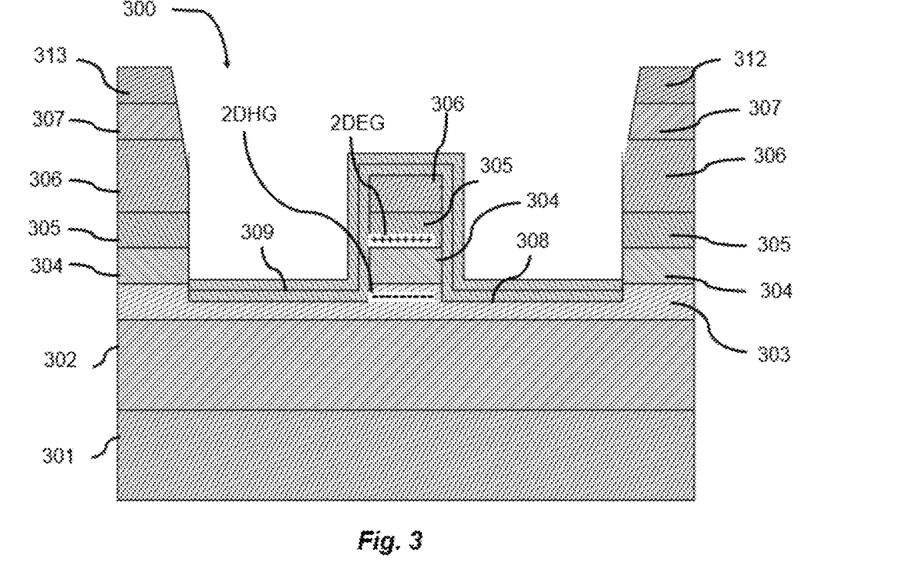
FIG. 3 is a schematic illustrating a cross-section view along a BB' axis of FIG. 1 according to an embodiment of the present disclosure.

FIG. 3 represents a cross-section view along a BB' axis of FIG. 1 according to an embodiment of the present disclosure.

In the illustrated embodiment, the element 300, 301, 302, 303, 304, 305, 306, 307, 308, 309, 312 and 313, respectively, is equivalent to the element 100, 101, 102, 103, 104, 105, 106, 107, 108, 109, 112 and 113, respectively.

Specifically, this cross-section view along the BB' axis depicts more clearly the fin structure of the n-channel and how to form the illustrated vertical stack of layers.

In one embodiment, the formation of both the p-channel and n-channel fins occurs simultaneously. For instance, the top p++-GaN layer 307 and part of the p-GaN layer 306 region are etched using a self-aligned process, called self-aligned etching step, said step being carried out similarly for fabricating the p-FET. In a subsequent etching step, the p-GaN layer 306, the UID-GaN layer 305, the barrier layer 304, and one or more parts of the GaN channel layer 303 are etched to form the fin.

Advantageously, a single mask can be used to carry out the aforementioned etching steps.

In one embodiment, u and upon completion of the various etching steps, a covering step can be carried out so as to cover the etched, or exposed, regions with the passivation layer 308. Subsequently, a step of depositing the gate terminal 309 can be carried out.

Figure 4:
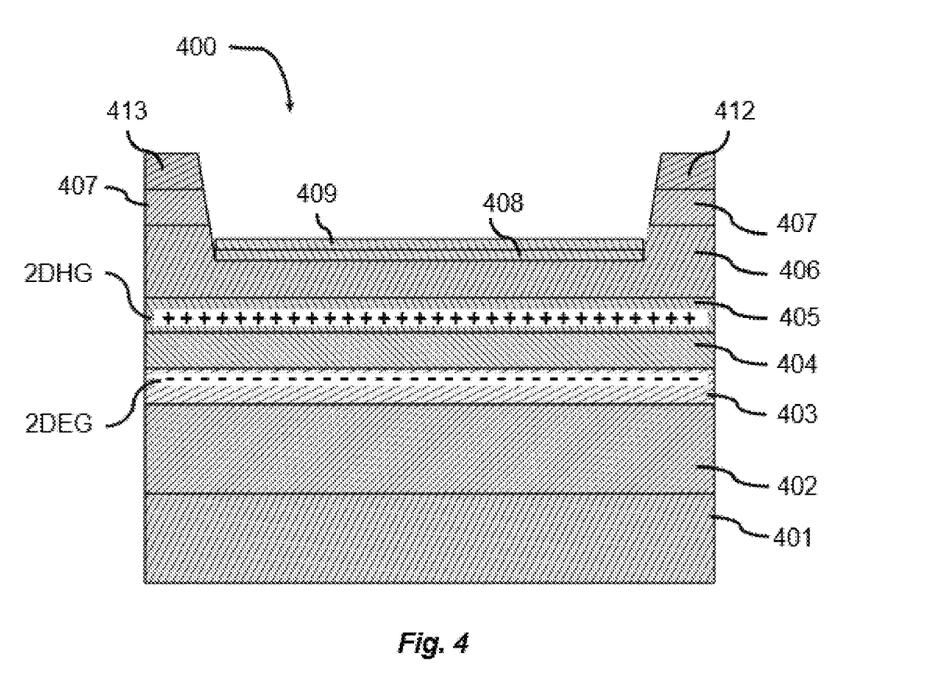
FIG. 4 is a schematic illustrating a cross-section view along a CC' axis of FIG. 1 according to an embodiment of the present disclosure.

FIG. 4 represents a cross-section view along a CC' axis of FIG. 1 according to an embodiment of the present disclosure.

In the illustrated embodiment, the element 400, 401, 402, 403, 404, 405, 406, 407, 408, 409, 412 and 413, respectively, is equivalent to the element 100, 101, 102, 103, 104, 105, 106, 107, 108, 109, 112 and 113, respectively.

Specifically, this cross-section view along the CC' axis depicts more clearly the fin structure of the p-channel, i.e., a fin of the p-FET, shows the conduction path of the p-FET and how the conduction path of the p-FET is enabled through the various layers.

In one embodiment, the epitaxial layers include the p-GaN layer 406 which is slightly etched, as well as the UID-GaN layer 405, in addition to the AlGaN barrier layer 404 and the GaN channel layer 403.

In one embodiment, the second drain terminal 412 and the second source terminal 413 are configured to be ohmic to holes.

As a result, the conduction path from the second source terminal 413 to the second drain terminal 412 is completed via the p++-GaN layer 407, the p-GaN layer 406, and the two-dimensional hole gas represented by "2DHG".

Advantageously, at zero gate bias, the 2DHG channel is depleted due to the fin structure of the semiconductor device 400, considering that the gate terminal 409 is positioned over the passivation layer 408, enclosing the 2DHG channel from three different sides, thereby ensuring enhanced operation when using the semiconductor device.

In this cross-section, only the upper portion of the gate terminal 409 is visible.

Advantageously also, when a negative gate bias is applied, the two-dimensional hole gas represented by "2DHG" is restored electrostatically, thereby completing the conduction path between the second source terminal 413 and the second drain terminal 412.

Figure 5:
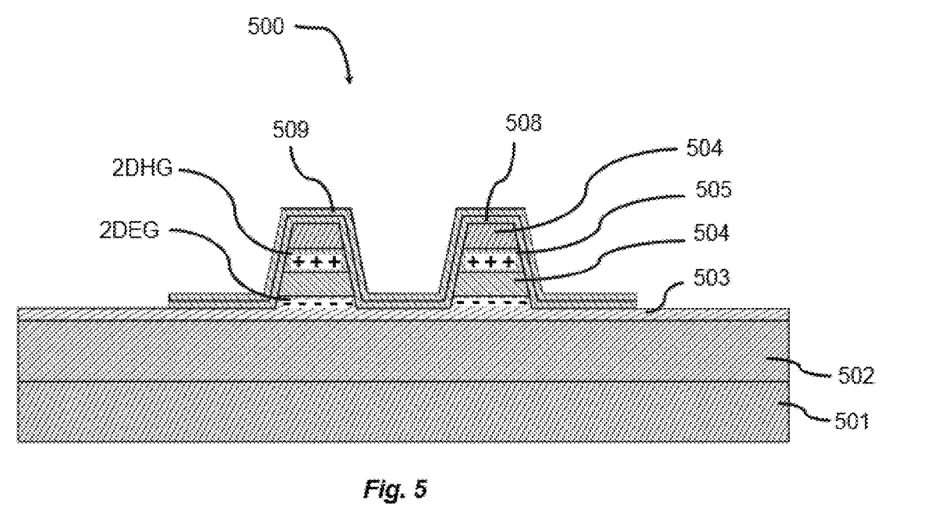
FIG. 5 is a schematic illustrating a cross-section view along a DD' axis of FIG. 1 according to an embodiment of the present disclosure.

FIG. 5 represents a cross-section view along a DD' axis of FIG. 1 according to an embodiment of the present disclosure.

In the illustrated embodiment, the element 500, 501, 502, 503, 504, 505, 506, 508 and 509, respectively, is equivalent to the element 100, 101, 102, 103, 104, 105, 106, 108 and 109, respectively. The p++-GaN layer is not visible, nor are the source and drain terminals.

Specifically, this cross-section view along the DD' axis depicts more clearly the fin of the p-FET channels.

In one embodiment, advantageously, the channels may be depleted of holes due to the metal gate enclosing the fins. This further ensures the operation of the semiconductor device 500 in an enhancement mode.

In one embodiment, the number of fins can be selected to further optimize the shape, the dimensions and the functionalities of the semiconductor device 500.

Figure 6:
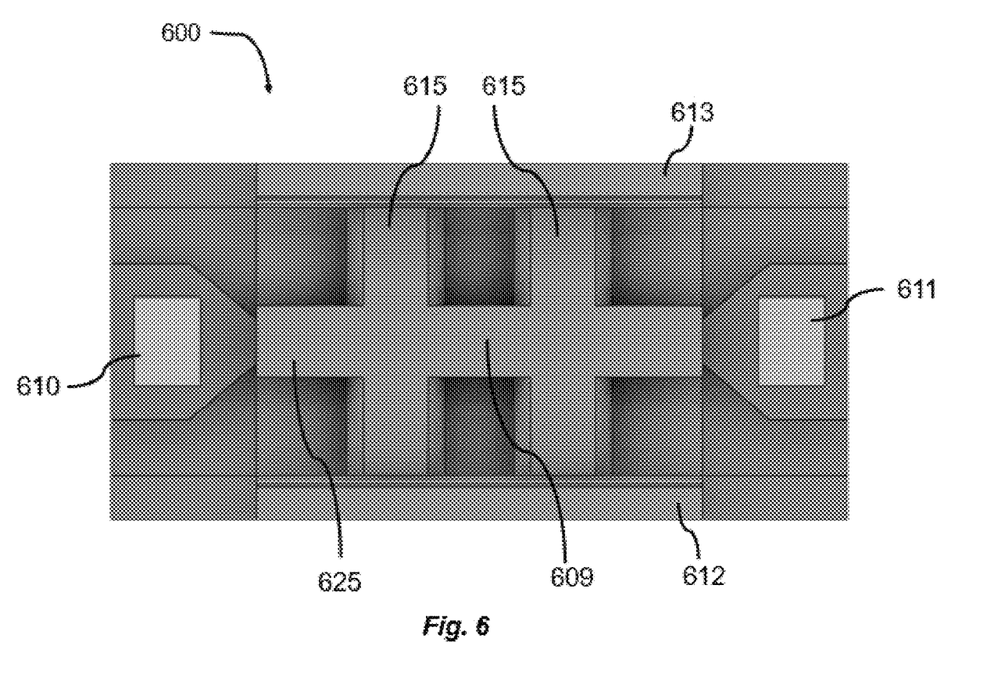
FIG. 6 is a schematic illustrating a view from the top of the device according to an embodiment of the present disclosure.

FIG. 6 represents a view from atop of the device according to an embodiment of the present disclosure.

In the illustrated embodiment, the element 600, 610, 611, 612 and 613, respectively, is equivalent to the element 100, 110, 111, 112 and 113, respectively.

Specifically, this view from atop depicts more clearly the fins from the n-FET part and from the p-FET part of the semiconductor device 600.

In one embodiment, the fins 625 of the n-FET part and the finds 615 of p-FET part of the semiconductor device 600 are arranged transversely to one another.

Advantageously, this ensures sufficient space for the placement of contacts, such as the first drain terminal 610, the first source terminal 611, the second drain terminal 612 and/or the second source terminal 613 while also mitigating the effects of non-homogeneous potential distribution across the channels. Such effects can be due to the bias applied to a device opposed to the semiconductor device 600.

In one embodiment, a single gate terminal 609 encapsulates the fins 615 and 625, i.e., the fins of both the n-FET and p-FET.

Advantageously, this eliminates the need for additional interconnecting metal between the gate terminal(s) of the n-FET and p-FET when enabling CMOS operation.

Surprisingly, this arrangement was also shown as significantly reducing the input capacitance and as strongly increasing the speed of operation of the semiconductor device 600.

Advantageously, the n-channel and p-channel are vertically stacked, allowing for the vertical integration of the n-FET and p-FET without the requirement for regrowth or heterogeneous integration. This arrangement reduces area consumption and provides tighter integration, which is highly advantageous in semiconductor device fabrication.

Figure 7A:
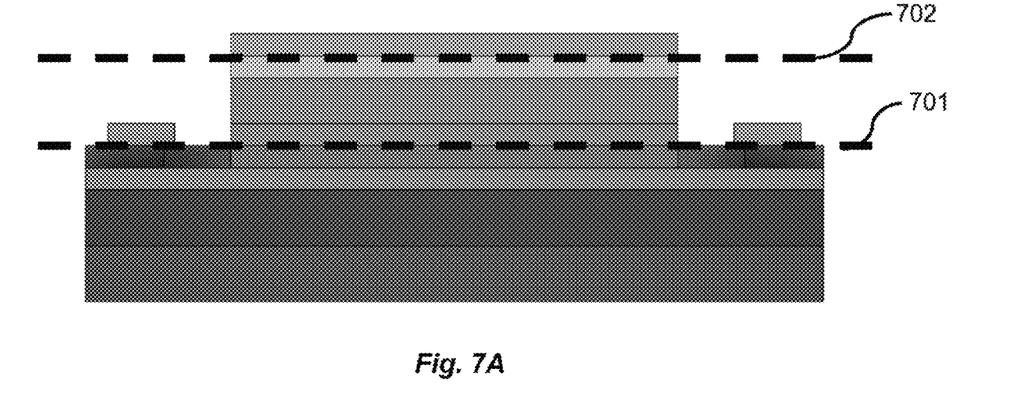
FIG. 7A is a schematic illustrating a first side view of the device according to an embodiment of the present disclosure.
Figure 7B:
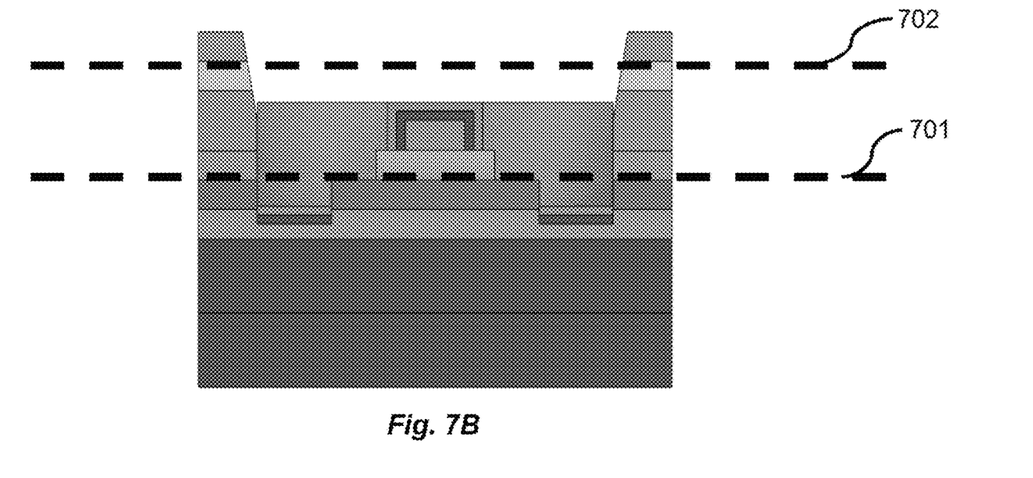
FIG. 7B is a schematic illustrating a second side view of the device according to an embodiment of the present disclosure.

FIG. 7A represents a first side view of the device according to an embodiment of the present disclosure. FIG. 7B represents a second side view of the device according to the same embodiment of the present disclosure.

Specifically, these views from the side of the semiconductor device depicts more clearly the position of the various terminals with respect to the various layers of the semiconductor device.

In one embodiment, for instance, the first drain and source terminals, which are ohmic to electrons, are positioned in the plane(s) 701. The second drain and source terminals, which are ohmic to holes, are located in the plane(s) 702.

Figure 8:
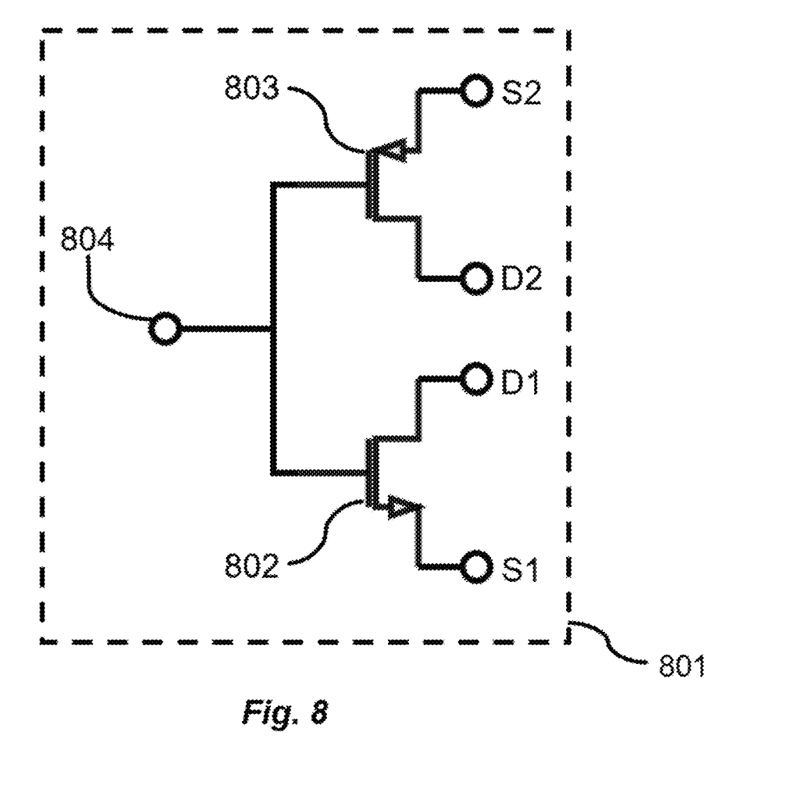
FIG. 8 is a schematic illustrating an equivalent circuit of the device according to an embodiment of the present disclosure.

FIG. 8 illustrates an equivalent circuit of the device according to an embodiment of the present disclosure.

Specifically, the electronic schematic 801 represents the equivalent circuit representation of the semiconductor device 100 (and 200, 300, 400, 500, 600), which comprises both an n-FET 802 and a p-FET 803, the n-FET 802 and the p-FET 803 being vertically stacked and sharing a common gate terminal 804.

Advantageously, mathematical equations can be established to describe the relations between the physical parameters of the semiconductor device 100 with respect to the equivalent circuit representation defined by the electronic schematic 801, and to control the device. In this equivalent circuit representation, "S1" denotes the first source terminal, "S2" denotes the second source terminal, "D1" denotes the first drain terminal and "D2" denotes the second drain terminal. The element 802 designates the n-FET part of the circuit, the element 803 designates the p-FET part of the circuit, while 804 defines its gate terminal, corresponding for instance to the previous element 109.

In one embodiment, the physical parameters of the semiconductor device comprise, among others, the pitch of the fins of the element 802 and/or 803, i.e., $W_n$ and/or $W_p$, as well as the number of fins of the element 802 and/or 803, i.e., $n_{n\text{-}fin}$ and/or $n_{p\text{-}fin}$. These physical parameters can specifically be adjusted when designing or manufacturing the semiconductor device.

In one embodiment, the magnitude of the electric drive currents which can be obtained at the level of the n-FET part of the circuit, i.e., "$I_{D,n}$" for 802, and at the level of the p-FET part of the circuit, i.e., "$I_{D,p}$" for 803, can be computed based on the two following mathematical equations "eq1" and "eq2":

$$I_{D,n} \propto \mu_n \times \frac{W_n}{L_n} \approx \mu_n \times \frac{n_{n\text{-}fin} \times w_{n\text{-}fin}}{n_{p\text{-}fin} \times w_{p\text{-}fin}} \quad \text{(eq1)}$$

$$I_{D,p} \propto \mu_p \times \frac{W_p}{L_p} \approx \mu_p \times \frac{n_{p-fin} \times w_{p-fin}}{n_{n-fin} \times w_{n-fin}} \quad \text{(eq2)}$$

It is known that the ratio of transconductance parameters of given n-channel transistor and p-channel transistor parts of a GaN CMOS application is typically expressed by the following equation "eq3":

$$\frac{\beta_n}{\beta_p} = \frac{\mu_n C_{OX}\left(\frac{W_n}{L_n}\right)}{\mu_p C_{OX}\left(\frac{W_p}{L_p}\right)} \quad \text{(eq3)}$$

In this expression, $\beta_n$ and $\beta_p$ correspond to the transconductance parameters of the n-channel and p-channel transistors, respectively, which define the current-driving capability of each device. The term $\mu_n$ represents the electron mobility in the n-channel, while $\mu_p$ represents the hole mobility in the p-channel. The factor "$C_{ox}$" corresponds to the gate oxide capacitance per unit area, which is generally assumed to be similar for transistors obtained by a given fabrication process. The terms $W_n/L_n$ and $W_p/L_p$ denote the width-to-length ratios of the n-FET and p-FET, respectively, which define the geometrical scaling of the devices.

Since the electron mobility $\mu_n$ in GaN devices is significantly higher than the hole mobility $\mu_p$, the ratio of $\beta_n$ and $\beta_p$ is inherently large, which could lead to an imbalance in the current-driving capabilities of the n-FET and p-FET.

However, the aforementioned embodiments advantageously enable compensating for imbalances and discrepancies in view of achieving matched drive currents, avoiding large device footprint and parasitic capacitances that can negatively impact circuit performance and switching speed. Specifically, when incorporating the semiconductor device of any of the aforementioned embodiments in a GaN CMOS application, it is advantageous to select and/or optimize the previously described physical parameters in view of mitigating imbalances in carrier mobility between electrons and holes.

Advantageously, by appropriately adjusting the fin pitch, the number of fins, and the respective width-to-length ratios of the transistors, imbalances in carrier mobility can be mitigated directly by selecting and/or optimizing the physical parameters in the following mathematical expression:

This, in turn, enables effectively controlling the ratio of $\beta_n$ and $\beta_p$ by adjusting the parameters in the following relationship "eq4", providing a broader optimization scope and extending the design flexibility of semiconductor devices.

$$\frac{\beta_n}{\beta_p} \approx \frac{\mu_n}{\mu_p} \times \left(\frac{n_{n-fin}}{n_{p-fin}}\right)^2 \times \left(\frac{w_{n-fin}}{w_{p-fin}}\right)^2 \quad \text{(eq4)}$$

As used in the specification and claims, the terms "for example," "for instance," and "such as," and the verbs "comprising," "having," "including," and their other verb forms, when used in conjunction with a listing of one or more components or other items, are each to be construed as open ended, meaning that the listing is not be considered as excluding others, additional components or items. The term "based on" means at least partially based on. Further, it is to be understood that the phraseology and terminology employed herein are for the purpose of any description and should not be regarded as limiting.

Although the present disclosure and the embodiments described therein have been shown and described with reference to specific preferred embodiments, this is not to be construed as limiting the invention itself. Various changes may be made in form and details without departing from the scope of the invention as defined by the appended claims.

Further aspects of the present invention are defined in the following numbered clauses:

A. A semiconductor device (100; 200; 300; 400; 500; 600), comprising:
   a substrate layer (101; 201; 301; 401; 501),
   a buffer layer (102; 202; 302; 402; 502) arranged on the substrate layer (101; 201; 301; 401; 501),
   a channel layer (103; 203; 303; 403; 503) arranged on the buffer layer (102; 202; 302; 402; 502),
   a barrier layer (104; 204; 304; 404; 504) arranged on the channel layer (103; 203; 303; 403; 503; 603), the barrier layer (104; 204; 304; 404; 504; 604) forming a two-dimensional electron gas (2DEG), at an interface with the channel layer (103; 203; 303; 403; 503; 603),
   a plurality of epitaxial layers (105, 106, 107; 205, 206, 207; 305, 306, 307; 405, 406, 407; 505, 507) arranged on the barrier layer (104; 204; 304; 404; 504), forming a two-dimensional hole gas (2DHG), at an interface with the barrier layer (104; 204; 304; 404; 504; 604),
   at least two source terminals (111, 113; 211; 313; 413; 611, 613), a first of the at least two source terminal (111, 113; 211; 313; 407; 611, 613), called first source terminal (111; 211; 611), being electrically connected to the two-dimensional electron gas (2DEG), and a second of the at least two source terminal (111, 113; 211; 313; 407; 611, 613), called second source terminal (113; 313; 413; 613), being electrically connected to the two-dimensional hole gas (2DHG),
   at least two drain terminals (110, 112; 210; 312; 412; 610, 612), a first of the at least two drain terminals (110, 112; 210; 312; 412; 610, 612), called first drain terminal (110; 210; 610) being electrically connected to the two-dimensional electron gas (2DEG), and a second of the at least two drain terminals (110, 112; 210; 312; 412; 610, 612), called second drain terminal (112; 312; 412; 612) being electrically connected to the two-dimensional hole gas (2DHG), and
   a gate terminal (109; 209; 309; 409; 509; 609) arranged over a passivation layer (108; 208; 308; 408; 508; 608) of the semiconductor device (100; 200; 300; 400; 500; 600), the passivation layer (108; 208; 308; 408; 508; 608) being positioned over one of the epitaxial layers (105, 106, 107; 205, 206, 207; 305, 306, 307; 405, 406, 407; 505, 507), the gate terminal (109; 209; 309; 409; 509; 609) being configured to control electrical conduction in the two-dimensional electron gas (2DEG) and in the two-dimensional hole gas (2DHG).

B. The semiconductor device (100; 200; 300; 400; 500; 600) according to clause A, wherein one of the epitaxial layers (105; 205; 305; 405; 505; 605) comprises unintentionally doped gallium nitride, UID-GaN.

C. The semiconductor device (100; 200; 300; 400; 500; 600) according to clause A or B, wherein one of the epitaxial layers (106; 206; 306; 406; 506; 606) comprises p-type doped gallium nitride, p-GaN.

D. The semiconductor device (100; 200; 300; 400; 500; 600) according to any of the preceding clauses, wherein one of the epitaxial layers (107; 207; 307; 407; 507; 607) comprises p++-doped gallium nitride, p++-GaN.

E. The semiconductor device (100; 200; 300; 400; 500; 600) according to any of the preceding clauses, wherein the barrier layer (104; 204; 304; 404; 504; 604) is a III-N barrier layer.

F. The semiconductor device (100; 200; 300; 400; 500; 600) according to any of the preceding clauses, wherein the barrier layer (104; 204; 304; 404; 504; 604) comprises aluminum gallium nitride, AlGaN, G. The semiconductor device (100; 200; 300; 400; 500; 600) according to any of the preceding clauses, wherein the first source terminal (111; 211; 311; 411; 611) and the first drain terminal (110; 210; 310; 410; 610) are arranged on a first plane extending substantially along the channel layer (103; 203; 303; 403; 503), and wherein the second source terminal (113; 213; 313; 413; 613) and the second drain terminal (112; 212; 312; 412; 612) are arranged on a second plane distinct from the first plane and extending substantially along one of the epitaxial layers (105, 106, 107; 205, 206, 207; 305, 306, 307; 405, 406, 407; 505, 507).

H. The semiconductor device (100; 200; 300; 400; 500; 600) according to clause G, wherein the first drain and first source terminals are positioned on a common horizontal plane, whereas the second drain and second source terminals are situated on a separate horizontal plane, with the two planes distinctly separated.

I. The semiconductor device (100; 200; 300; 400; 500; 600) according to clause G, wherein the first drain terminal (110; 210; 610) and the first source terminal (111; 211; 611) are arranged on a first plane, and wherein the second drain terminal (112; 312; 412; 612) and the second source terminal (113; 313; 413; 613) are arranged on a second plane distinct from the first plane.

J. The semiconductor device (100; 200; 300; 400; 500; 600) according to any of the preceding clauses, wherein the gate terminal (109; 209; 309; 409; 509; 609) is arranged over the passivation layer (108; 208; 308; 408; 508; 608), the passivation layer (108; 208; 308; 408; 508; 608) being positioned between the gate terminal (109; 209; 309; 409; 509; 609) and one of the epitaxial layers (105, 106, 107; 205, 206, 207; 305, 306, 307; 405, 406, 407; 505, 507).

K. The semiconductor device (100; 200; 300; 400; 500; 600) according to any of the preceding clauses, wherein the first source terminal (111; 211; 611) and the first drain terminal (110; 210; 610) are ohmic to electrons, and wherein the second source terminal (113; 313; 413; 613) and the second drain terminal (112; 312; 412; 612) are ohmic to holes.

L. The semiconductor device (100; 200; 300; 400; 500; 600) according to any of the preceding clauses, wherein the gate terminal (109; 209; 309; 409; 509; 609) comprises a single gate terminal (109; 209; 309; 409; 509; 609), the single gate terminal (109; 209; 309; 409; 509; 609) encapsulating a plurality of fins of the semiconductor device (100; 200; 300; 400; 500; 600), each fin extending into the channel layer (103; 203; 303; 403; 503; 603), the plurality of fins including a first set of fins extending into a region of the formed two-dimensional electron gas (2DEG), the plurality of fins further including a second set of fins extending into a region of the formed two-dimensional hole gas (2DHG), the first set of fins and the second set of fins being arranged transversely to each other.

M. The semiconductor device (100; 200; 300; 400; 500; 600) according to clause L, wherein the gate terminal (109; 209; 309; 409; 509; 609) extends over and along at least three sides of each fin of the plurality of fins, the plurality of fins including a first set of fins extending into a region of the formed two-dimensional electron gas (2DEG) and a second set of fins extending into a region of the formed two-dimensional hole gas (2DHG), the passivation layer (108; 208; 308; 408; 508; 608) being positioned between the gate terminal (109; 209; 309; 409; 509; 609) and the plurality of fins.

N. The semiconductor device (100; 200; 300; 400; 500; 600) according to clause L, wherein the first set of fins defines a first Field Effect Transistor, called first FET, and the second set of fins defines a second Field Effect Transistor, called second FET, the number and the pitch of the fins of the first FET and the number and the pitch of the fins of the second FET being selected according to the proportionality equations $$\frac{W_n}{L_n} \approx \frac{n_{n-fin} \times W_{n-fin}}{n_{p-fin} \times W_{p-fin}}, \text{ and}$$

$$\frac{W_p}{L_p} \approx \frac{n_{p-fin} \times W_{p-fin}}{n_{n-fin} \times W_{n-fin}},$$

$W_n$ and $W_p$ denoting the effective channel widths of the first FET and the second FET, respectively, $L_n$ and $L_p$ denoting the effective channel lengths of the first FET and the second FET, respectively, $n_{n-fin}$ and $n_{p-fin}$ denoting the respective numbers of fins of the first FET and the second FET, $W_{n-fin}$ and $W_{p-fin}$ denoting the respective fin widths of the first FET and the second FET.

O. A method of manufacturing a semiconductor device (100; 200; 300; 400; 500; 600), comprising the steps of:
  forming a buffer layer (102; 202; 302; 402; 502) on a substrate (101; 201; 301; 401; 501),
  forming a channel layer (103; 203; 303; 403; 503) on the buffer layer (102; 202; 302; 402; 502),
  forming a barrier layer (104; 204; 304; 404; 504) on the channel layer (103; 203; 303; 403; 503), a two-dimensional electron gas (2DEG) being induced at an interface between the channel layer (103; 203; 303; 403; 503) and the barrier layer (104; 204; 304; 404; 504),
  forming a plurality of epitaxial layers (105, 106, 107; 205, 206, 207; 305, 306, 307; 405, 406, 407; 505, 507) on the barrier layer (104; 204; 304; 404; 504), a two-dimensional hole gas (2DHG) being induced at an interface between the barrier layer (104; 204; 304; 404; 504) and at least one of the epitaxial layers 105, 106, 107; 205, 206, 207; 305, 306, 307; 405, 406, 407; 505, 507),
  forming a passivation layer (108; 208; 308; 408; 508; 608) over one of the epitaxial layers (105, 106, 107; 205, 206, 207; 305, 306, 307; 405, 406, 407; 505, 507),
  forming a gate terminal (109; 209; 309; 409; 509; 609) over the passivation layer (108; 208; 308; 408; 508; 608), the gate terminal (109; 209; 309; 409; 509; 609) being configured to control electrical conduction in both the two-dimensional electron gas (2DEG) and the two-dimensional hole gas (2DHG),
  forming at least two source terminals (111, 113; 211; 313; 413; 611, 613), a first of the at least two source terminals (111, 113; 211; 313; 413; 611, 613), called first source terminal (111; 211; 611), being electrically connected to the two-dimensional electron gas (2DEG), and a second of the at least two source terminals (111, 113; 211; 313; 413; 611, 613), called second source terminal (113; 313; 413; 613), being electrically connected to the two-dimensional hole gas (2DHG), and
  forming at least two drain terminals (110, 112; 210; 312; 412; 610, 612), a first of the at least two drain terminals (110, 112; 210; 312; 412; 610, 612), called first drain terminal (110; 210; 610), being electrically connected to the two-dimensional electron gas (2DEG), and a second of the at least two drain terminals (110, 112; 210; 312; 412; 610, 612), called second drain terminal (112; 312; 412; 612), being electrically connected to the two-dimensional hole gas (2DHG).

The invention claimed is:

1. A semiconductor device comprising:
a substrate layer;
a buffer layer disposed on the substrate layer;
a channel layer disposed on the buffer layer;
a barrier layer disposed on the channel layer, the barrier layer forming a two-dimensional electron gas (2DEG) at an interface with the channel layer;
a plurality of epitaxial layers disposed on the barrier layer, forming a two-dimensional hole gas (2DHG) at an interface with the barrier layer;
at least two source terminals, a first of the at least two source terminals, called first source terminal, being electrically connected to the two-dimensional electron gas (2DEG), and a second of the at least two source terminals, called second source terminal, being electrically connected to the two-dimensional hole gas (2DHG);
at least two drain terminals, a first of the at least two drain terminals, called first drain terminal, being electrically connected to the two-dimensional electron gas (2DEG), and a second of the at least two drain terminals, called second drain terminal, being electrically connected to the two-dimensional hole gas (2DHG); and
a gate terminal disposed over a passivation layer of the semiconductor device, the passivation layer being positioned over one of the epitaxial layers,
wherein the gate terminal is configured to control electrical conduction in the two-dimensional electron gas (2DEG) and in the two-dimensional hole gas (2DHG).

2. The semiconductor device according to claim 1, wherein one of the epitaxial layers comprises unintentionally doped gallium nitride, UID-GaN.

3. The semiconductor device according to claim 1, wherein one of the epitaxial layers comprises p-type doped gallium nitride, p-GaN.

4. The semiconductor device according to claim 1, wherein one of the epitaxial layers comprises p++-doped gallium nitride, p++-GaN.

5. The semiconductor device according to claim 1, wherein the barrier layer is a III-N barrier layer.

6. The semiconductor device according to claim 1, wherein the barrier layer comprises aluminum gallium nitride, AlGaN.

7. The semiconductor device according to claim 1, wherein the first source terminal and the first drain terminal are disposed on a first plane extending substantially along the channel layer, and wherein the second source terminal and the second drain terminal are disposed on a second plane distinct from the first plane and extending substantially along one of the epitaxial layers.

8. The semiconductor device according to claim 7, wherein the first drain and first source terminals are positioned on a common horizontal plane, whereas the second drain and second source terminals are situated on a separate horizontal plane, with the two planes distinctly separated.

9. The semiconductor device according to claim 7, wherein the first drain terminal and the first source terminal are disposed on a first plane, and wherein the second drain terminal and the second source terminal are disposed on a second plane distinct from the first plane.

10. The semiconductor device according to claim 1, wherein the gate terminal is disposed over the passivation layer, the passivation layer being positioned between the gate terminal and one of the epitaxial layers.

11. The semiconductor device according to claim 1, wherein the first source terminal and the first drain terminal are ohmic to electrons, and wherein the second source terminal and the second drain terminal are ohmic to holes.

12. The semiconductor device according to claim 1, wherein the gate terminal consists of a single gate terminal, the single gate terminal encapsulating a plurality of fins of the semiconductor device, each fin extending into the channel layer, the plurality of fins including a first set of fins extending into a region of the formed two-dimensional electron gas (2DEG), the plurality of fins further including a second set of fins extending into a region of the formed two-dimensional hole gas (2DHG), the first set of fins and the second set of fins being disposed transversely to each other.

13. The semiconductor device according to claim 12, wherein the gate terminal extends over and along at least three sides of each fin of the plurality of fins, the plurality of fins including a first set of fins extending into a region of the formed two-dimensional electron gas (2DEG) and a second set of fins extending into a region of the formed two-dimensional hole gas (2DHG), the passivation layer being positioned between the gate terminal and the plurality of fins.

14. The semiconductor device according to claim 12, wherein the first set of fins defines a first Field Effect Transistor, called first FET, and the second set of fins defines a second Field Effect Transistor, called second FET, the number and the pitch of the fins of the first FET and the number and the pitch of the fins of the second FET being selected according to the proportionality equations:

$$\frac{W_n}{L_n} \approx \frac{n_{n\text{-}fin} \times W_{n\text{-}fin}}{n_{p\text{-}fin} \times W_{p\text{-}fin}}, \text{ and}$$

$$\frac{W_p}{L_p} \approx \frac{n_{p\text{-}fin} \times W_{p\text{-}fin}}{n_{n\text{-}fin} \times W_{n\text{-}fin}},$$

$W_n$ and $W_p$ denoting the effective channel widths of the first FET and the second FET, respectively, $L_n$ and $L_p$ denoting the effective channel lengths of the first FET and the second FET, respectively, $n_{n\text{-}fin}$ and $n_{p\text{-}fin}$ denoting the respective numbers of fins of the first FET and the second FET, $W_{n\text{-}fin}$ and $W_{p\text{-}fin}$ denoting the respective fin widths of the first FET and the second FET.

15. A method of manufacturing a semiconductor device, the method comprising:
forming a buffer layer on a substrate;
forming a channel layer on the buffer layer;
forming a barrier layer on the channel layer, a two-dimensional electron gas (2DEG) being induced at an interface between the channel layer and the barrier layer;
forming a plurality of epitaxial layers on the barrier layer, a two-dimensional hole gas (2DHG) being induced at an interface between the barrier layer and at least one of the epitaxial layers;
forming a passivation layer over one of the epitaxial layers;

forming a gate terminal over the passivation layer, the gate terminal being configured to control electrical conduction in both the two-dimensional electron gas (2DEG) and the two-dimensional hole gas (2DHG);

forming at least two source terminals, a first of the at least two source terminals, called first source terminal, being electrically connected to the two-dimensional electron gas (2DEG), and a second of the at least two source terminals, called second source terminal, being electrically connected to the two-dimensional hole gas (2DHG); and forming at least two drain terminals, wherein a first of the at least two drain terminals, called first drain terminal, is electrically connected to the two-dimensional electron gas (2DEG), and wherein a second of the at least two drain terminals, called second drain terminal, is electrically connected to the two-dimensional hole gas (2DHG).

\* \* \* \* \*